United States Patent
Vacar et al.

(10) Patent No.: US 7,162,393 B1
(45) Date of Patent: Jan. 9, 2007

(54) DETECTING DEGRADATION OF COMPONENTS DURING RELIABILITY-EVALUATION STUDIES

(75) Inventors: Dan Vacar, San Diego, CA (US);
Kenny C. Gross, San Diego, CA (US);
David K. McElfresh, San Diego, CA (US); Leoncio D. Lopez, Escondido, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/219,091

(22) Filed: Sep. 1, 2005

(51) Int. Cl.
*G06F 11/30* (2006.01)
*G01B 3/44* (2006.01)
*G01B 5/28* (2006.01)

(52) U.S. Cl. .................. 702/183; 702/185; 702/34; 702/35

(58) Field of Classification Search ............... 702/183, 702/185, 182, 33, 34, 35, 36
See application file for complete search history.

(56) References Cited

U.S. PATENT DOCUMENTS

2005/0021212 A1* 1/2005 Gayme et al. ................ 701/99

\* cited by examiner

*Primary Examiner*—John Barlow
*Assistant Examiner*—Meagan S Walling
(74) *Attorney, Agent, or Firm*—Park, Vaughan & Fleming, LLP; Gilbert C. Wong

(57) ABSTRACT

One embodiment of the present invention provides a system that determines the reliability of a component in a system. During operation, the system monitors inferential variables associated with a number of specimens of the component. The system then collects degradation data by first computing a likelihood value that indicates whether an inferential variable associated with a specimen of the component is behaving normally or abnormally. Next, the system determines whether the specimen of the component has degraded based on the likelihood value. If the specimen of the component is determined to have degraded, the system records the time when the specimen of the component was determined to have degraded. The system also uses the degradation data to determine the reliability of the component in the system.

21 Claims, 2 Drawing Sheets

DETECTING DEGRADATION OF COMPONENTS DURING RELIABILITY-EVALUATION STUDIES

RELATED APPLICATION

The subject matter of this application is related to the subject matter in a co-pending non-provisional application by inventors Kenny C. Gross, Becky X. Li, and Keith A. Whisnant, "Optimal Bandwidth and Power Utilization For Ad Hoc Networks of Wireless Smart Sensors," having Ser. No. 11/195,565, and filing date 2 Aug. 2005.

BACKGROUND

1. Field of the Invention

The present invention relates to techniques for determining the reliability of a component in a system. More specifically, the present invention relates to a method and apparatus for determining the reliability of a component by identifying the onset of hardware degradation during an accelerated-life study of the component.

2. Related Art

An increasing number of businesses are using computer systems for mission-critical applications. In such applications, a component failure can have a devastating effect on the business. For example, the airline industry is critically dependent on computer systems that manage flight reservations, and would essentially cease to function if these systems failed. Hence, it is critically important to measure component reliabilities to ensure that they meet or exceed the reliability requirements of the computer system.

Unfortunately, determining the reliability of a component can be very time consuming if reliability testing is performed under normal operating conditions. This is because, under normal conditions, a highly reliable component can take an inordinate amount of time to fail.

Consequently, component reliabilities are often determined using "reliability-evaluation studies." These reliability-evaluation studies can include "accelerated-life studies," which accelerate the failure mechanisms of a component, or burn-in studies, which determine if a particular component is functioning properly prior to being shipped to customers. These types of studies subject the component to stressful conditions, typically using environmental stress-test chambers to hold and/or cycle one or more stress variables (e.g. temperature, humidity, radiation flux, etc.) at levels that are believed to accelerate subtle failure mechanisms within the component. Note that, even under stress conditions, components typically need to be tested for time periods that may range from hours to months. Furthermore, it is usually not possible to test the components or systems while they are in the stress-test chambers. Consequently, to test the systems or components under stress, they are typically removed from the stress-test chambers and tested externally to count the number of components that have failed. The systems that have not failed are then returned to the stress-test chambers and are tested further. In this manner, a reliability-evaluation study generates a history of failed and not-failed system/component counts at discrete time intervals.

Unfortunately, reliability-evaluation studies are typically expensive and time consuming. These studies typically involve making a tradeoff between the number of units under test, and the time they are subjected to the stress test. If the components are expensive and/or in very short supply (e.g. pre-manufacturing prototype components, or high-end computer systems), long test windows are needed to get a statistically significant number of failures to draw meaningful age-dependent reliability conclusions. On the other hand, if the components are cheap and readily obtainable, such that a large population of components can be placed under stress, the ex-situ functional testing becomes resource-intensive because the stress-test needs to be halted frequently to evaluate how many units have failed.

Hence, what is needed is a method and an apparatus for determining the reliability of a component using an reliability-evaluation study technique without the above-described problems.

SUMMARY

One embodiment of the present invention provides a system that determines the reliability of a component in a system. During operation, the system monitors inferential variables associated with a number of specimens of the component. The system then collects degradation data by first computing a likelihood value that indicates whether an inferential variable associated with a specimen of the component is behaving normally or abnormally. Next, the system determines whether the specimen of the component has degraded based on the likelihood value. If the specimen of the component is determined to have degraded, the system records the time when the specimen of the component was determined to have degraded. The system also uses the degradation data to determine the reliability of the component in the system.

In a variation on this embodiment, the system determines whether the specimen of the component has degraded by first comparing the likelihood value with an upper threshold and comparing the likelihood value with a lower threshold. If the likelihood value is greater than or equal to the upper threshold, the system determines that the specimen of the component has degraded. If the likelihood value is less than or equal to the lower threshold, the system determines that the specimen of the component is behaving normally. If the likelihood value is between the upper threshold and the lower threshold, the system determines that an inadequate amount of information is available to determine whether the specimen of the component is behaving normally or whether the specimen of the component has degraded.

In a variation on this embodiment, the system computes the likelihood value by first computing the probability that a null hypothesis is true based on a current value of the inferential variable and historical values of the inferential variable. Note that the null hypothesis is true if the specimen of the component is behaving normally and has not degraded. Next, the system computes the probability that an alternative hypothesis is true using the current value of the inferential variable and historical values of the inferential variable. Note that the alternative hypothesis is true if the specimen of the component has degraded. The system then computes the likelihood value by dividing the probability that the alternative hypothesis is true by the probability that the null hypothesis is true.

In a variation on this embodiment, the alternative hypothesis test can include: a positive-mean test, which tests whether the mean of a time-series for the inferential variable is above a reference level; a negative-mean test, which tests whether the mean of the time-series for the inferential variable is below a reference level; a nominal-variance test, which tests whether the variance of the time-series for the inferential variable is proportional to a scale factor; a inverse-variance test, which tests whether the variance of the time-series for the inferential variable is proportional to the inverse of the scale factor; a positive first-difference test, which tests whether the time-series for the inferential variable is increasing; or a negative first-difference test, which tests whether the time-series for the inferential variable is decreasing.

In a variation on this embodiment, prior to monitoring an inferential variable, the system computes the mean and the variance of the time-series for the inferential variable by monitoring the inferential variable during a training phase. The mean and variance are then used to normalize the mean and the variance of the time-series for the inferential variable while monitoring the inferential variable during the monitoring phase.

In a variation on this embodiment, the inferential variable can represent a current passing through the component or a voltage applied to the component.

In a variation on this embodiment, the inferential variable is monitored during an accelerated-life study of the component. Note that the monitored data can be processed in real-time or can be post-processed.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Accelerated-Life Studies

For devices undergoing accelerated-life studies, it is often desirable to supply power to the devices under test while they are in the stress-test chambers. Note that though this specification discusses accelerated-life studies, this technique can be applied to any type of reliability-evaluation study. Even though it may not be possible to apply the full pass/fail functional testing to the devices inside the stress-test chamber, a change in the electrical behavior of the device can be detected by monitoring the signatures of the electrical current being applied to the devices. Note that subtle anomalies in the noise-signature time-series of the current for the device appear when the device degrades and/or fails. Also note that the current to the device is an indirect measure of the health of a device. The current-noise time series can be used as an "inferential variable" for high-resolution annunciation of the onset of degradation and, in many cases, the exact point of failure in time in the components undergoing accelerated-life studies.

Figure 1:
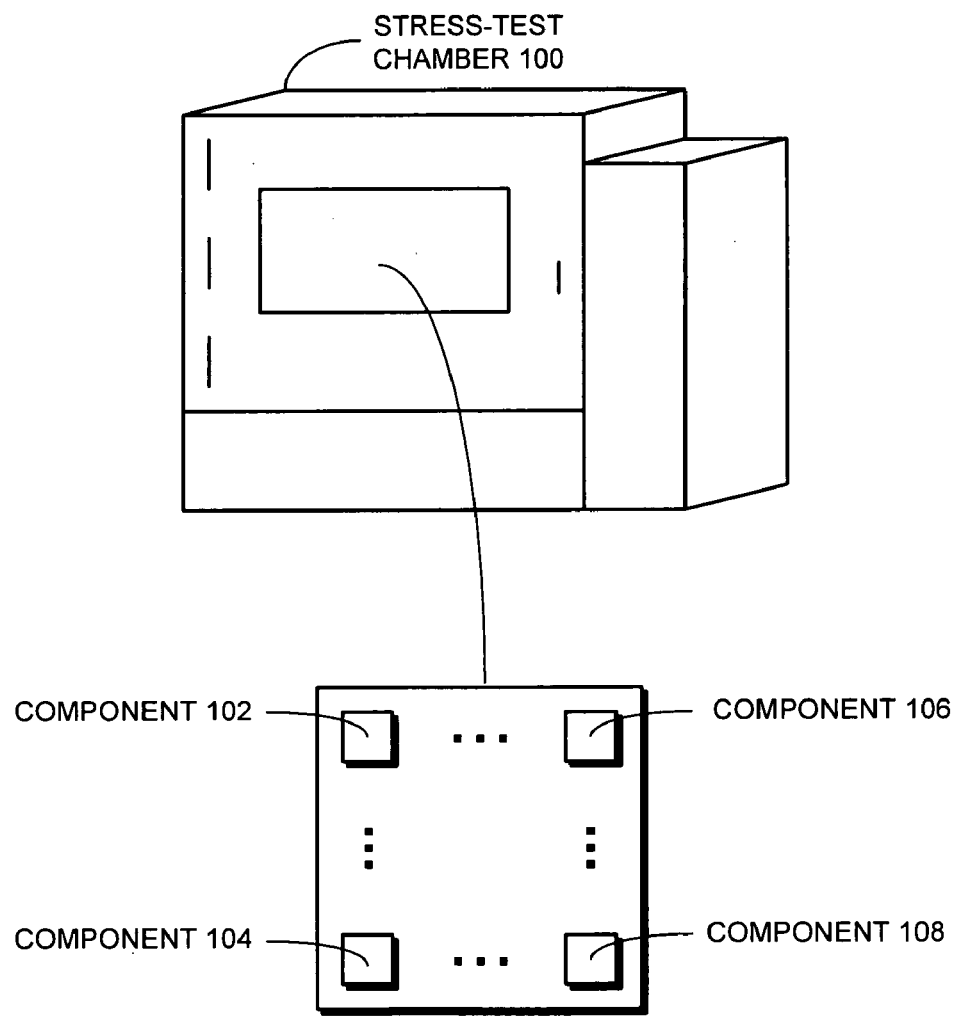
FIG. 1 illustrates an accelerated-life stress-test chamber in accordance with an embodiment of the present invention.

FIG. 1 illustrates accelerated-life stress-test chamber 100 in accordance with an embodiment of the present invention. It contains a plurality of components under stress-test, including components 102, 104, 106, and 108. Stress-test chamber 100 provides individual signal outputs for each component under test. The signal outputs from each component can include current, voltage, temperature, and other physical variables. Note that components 102, 104, 106, and 108 are tested at the same time under the same conditions. Also note that instead of testing multiple individual components, the stress-test chamber can be configured to test a single computer system.

One embodiment of the present invention integrates an ultra-sensitive sequential detection algorithm called the Sequential Probability Ratio Test (SPRT) for inferential variable surveillance to accurately identify the onset of component degradation and/or failure. Moreover, a tandem SPRT can be run on the derivative of the inferential variable's time series to accurately assess the point of failure. The combination of tandem SPRTs that monitor the inferential variables provides a robust surveillance scheme that has the capability to:

1. detect the onset of degradation in any individual component under stress, even when the overall functionality of that component cannot be measured directly; and to
2. detect the time of complete failure for any component under stress.

In one embodiment of the present invention, information from the tandem SPRT analyses is combined with discrete-time ex-situ pass/fail testing to construct a detailed population failure distribution.

Note that the present invention lessens the constraints on the tradeoff between the number of units under test and the duration of the experiments, while yielding much higher resolution information on the dynamic evolution of the health of the components as a function of age and cumulative stress. This higher resolution enables higher confidence in selecting a mathematical model that accurately predicts the long-term reliability of the component for a time point beyond the number of hours the component was actually tested.

Also note that the present invention minimizes expensive ex-situ functional evaluations.

SPRT (Sequential Probability Ratio Test)

The Sequential Probability Ratio Test is a statistical hypothesis test that differs from standard fixed sample tests. In fixed-sample statistical tests, a given number of observations are used to select one hypothesis from one or more alternative hypotheses. The SPRT, however, examines one observation at a time, and then makes a decision as soon as it has sufficient information to ensure that pre-specified confidence bounds are met.

The basic approach taken by the SPRT technique is to analyze successive observations of a discrete process. Let $y_n$ represent a sample from the process at a given moment $t_n$ in time. In one embodiment of the present invention, the sequence of values $\{Y_n\} = y_0, y_1, \ldots, y_n$ comes from a stationary process characterized by a Gaussian, white-noise probability density function (PDF) with mean 0. (Note that since with the sequence is from a nominally stationary processes, any process variables with a nonzero mean can be first normalized to a mean of zero with no loss of generality).

The SPRT is a binary hypothesis test that analyzes process observations sequentially to determine whether or not the signal is consistent with normal behavior. When a SPRT reaches a decision about current process behavior (i.e. the signal is behaving normally or abnormally), the system reports the decision and continues to process observations.

For each of the six types of tandem SPRT tests described below, the signal data adheres to a Gaussian PDF with mean 0 and variance $\sigma^2$ for normal signal behavior, referred to as the null hypothesis, $H_0$. The system computes six specific SPRT hypothesis tests in parallel for each inferential variable monitored. One embodiment of the present invention applies a SPRT to an electrical current time-series. Other embodiments of the present invention apply a SPRT to other inferential variables, including voltage, internal temperature, or stress variables.

The SPRT surveillance module executes all 6 tandem hypothesis tests in parallel. Each test determines whether the current sequence of process observations is consistent with the null hypothesis versus an alternative hypothesis. The first four tests are: (SPRT 1) the positive-mean test, (SPRT 2) the negative-mean test, (SPRT 3) the nominal-variance test, and (SPRT 4) the inverse-variance test. For the positive-mean test, the signal data for the corresponding alternative hypothesis, $H_1$, adheres to a Gaussian PDF with mean +M and variance $\sigma^2$. For the negative-mean test, the signal data for the corresponding alternative hypothesis, $H_2$, adheres to a Gaussian PDF with mean −M and variance $\sigma^2$. For the nominal-variance test, the signal data for the corresponding alternative hypothesis, $H_3$, adheres to a Gaussian PDF with mean 0 and variance $V\sigma^2$ (with scalar factor V). For the inverse-variance test, the signal data for the corresponding alternative hypothesis, $H_4$, adheres to a Gaussian PDF with mean 0 and variance $\sigma^2/V$.

The final two tandem SPRT tests are performed not on the raw inferential variables as above, but on the first difference function of the inferential variable. For discrete time series, the first difference function (i.e. difference between each observation and the observation preceding it) gives an estimate of the numerical derivative of the time series. During uninteresting time periods, the observations in the first difference function are a nominally stationary random process centered about zero. If an upward or downward trend suddenly appears in the signal, SPRTs number 5 and 6 observe an increase or decrease, respectively, in the slope of the inferential variable.

For example, if there is a decrease in the value of the inferential variable, SPRT alarms are triggered for SPRTs 2 and 6. SPRT 2 generates a warning because the sequence of raw observations drops with time. And SPRT 6 generates a warning because the slope of the inferential variable changes from zero to something less than zero. The advantage of monitoring the mean SPRT and slope SPRT in tandem is that the system correlates the SPRT readings from the six tests and determines if the component has failed. For example, if the signal levels off to a new stationary value (or plateau), the alarms from SPRT 6 cease because the slope returns to zero when the raw signal reaches a plateau. However, SPRT 2 will continue generating a warning because the new mean value of the signal is different from the value prior to the degradation. Therefore, the system correctly identifies that the component has failed.

If SPRTs 3 or 4 generates a warning, the variance of the inferential variable is either increasing or decreasing, respectively. An increasing variance that is not accompanied by a change in mean (inferred from SPRTs 1 and 2 and SPRTs 5 and 6) signifies an episodic event that is "bursty" or "spiky" with time. A decreasing variance that is not accompanied by a change in mean is a common symptom of a failing component that is characterized by an increasing time constant. Therefore, having variance SPRTs available in parallel with slope and mean SPRTs provides a wealth of supplementary diagnostic information that has not been possible with conventional accelerated-life studies.

The SPRT technique provides a quantitative framework that permits a decision to be made between the null hypothesis and the six alternative hypotheses with specified misidentification probabilities. If the SPRT accepts one of the alternative hypotheses, an alarm flag is set and data is transmitted.

The SPRT operates as follows. At each time step in a calculation, the system calculates a test index and compares it to two stopping boundaries A and B (defined below). The test index is equal to the natural log of a likelihood ratio ($L_n$), which for a given SPRT is the ratio of the probability that the alternative hypothesis for the test ($H_j$, where j is the appropriate subscript for the SPRT in question) is true, to the probability that the null hypothesis ($H_0$) is true.

$$L_n = \frac{\text{probability of observed sequence } \{Y_n\} \text{ given } H_j \text{ is true}}{\text{probability of observed sequence } \{Y_n\} \text{ given } H_0 \text{ is true}} \quad (1)$$

If the logarithm of the likelihood ratio is greater than or equal to the logarithm of the upper threshold limit [i.e., $\ln(L_n) > \ln(B)$], then the alternative hypothesis is true. If the logarithm of the likelihood ratio is less than or equal to the logarithm of the lower threshold limit [i.e., $\ln(L_n) < \ln(A)$], then the null hypothesis is true. If the log likelihood ratio falls between the two limits, [i.e., $\ln(A) < \ln(L_n) < \ln(B)$], then there is not enough information to make a decision (and, incidentally, no other statistical test could yet reach a decision with the same given Type I and II misidentification probabilities).

(2) relates the threshold limits to the misidentification probabilities $\alpha$ and $\beta$:

$$A = \frac{\beta}{1-\alpha}, B = \frac{1-\beta}{\alpha} \quad (2)$$

where $\alpha$ is the probability of accepting $H_j$ when $H_0$ is true (i.e., the false-alarm probability), and $\beta$ is the probability of accepting $H_0$ when $H_j$ is true (i.e., the missed-alarm probability).

The first two SPRT tests for normal distributions examine the mean of the process observations. If the distribution of observations exhibits a non-zero mean (e.g., a mean of either +M or −M, where M is the pre-assigned system disturbance magnitude for the mean test), the mean tests determine that the system is degraded. Assuming that the sequence $\{Y_n\}$ adheres to a Gaussian PDF, then the probability that the null hypothesis $H_0$ is true (i.e., mean 0 and variance $\sigma^2$) is:

$$P(y_1, y_2, \ldots, y_n | H_0) = \frac{1}{(2\pi\sigma^2)^{n/2}} \exp\left[-\frac{1}{2\sigma^2} \sum_{k=1}^{n} y_k^2\right] \quad (3)$$

Similarly, the probability for alternative hypothesis $H_1$ is true (i.e. mean M and variance $\sigma^2$) is:

$$P(y_1, y_2, \ldots, y_n | H_1) = \quad (4)$$
$$\frac{1}{(2\pi\sigma^2)^{n/2}} \exp\left[-\frac{1}{2\sigma^2}\left(\sum_{k=1}^{n} y_k^2 - 2\sum_{k=1}^{n} y_k M + \sum_{k=1}^{n} M^2\right)\right]$$

The ratio of the probabilities in (3) and (4) gives the likelihood ratio $L_n$ for the positive-mean test:

$$L_n = \exp\left[-\frac{1}{2\sigma^2} \sum_{k=1}^{n} M(M - 2y_k)\right] \quad (5)$$

Taking the logarithm of likelihood ratio given by (5) produces the SPRT index for the positive-mean test ($SPRT_{pos}$):

$$SPRT_{pos} = -\frac{1}{2\sigma^2} \sum_{k=1}^{n} M(M - 2y_k) = \frac{M}{\sigma^2} \sum_{k=1}^{n} \left(y_k - \frac{M}{2}\right) \quad (6)$$

The SPRT index for the negative-mean test ($SPRT_{neg}$) is derived by substituting $-M$ for each instance of M in (4) through (6) above, resulting in:

$$SPRT_{neg} = \frac{M}{\sigma^2} \sum_{k=1}^{n} \left(-y_k - \frac{M}{2}\right) \quad (7)$$

The remaining two SPRT tests examine the variance of the sequence. This capability gives the SPRT module the ability to detect and quantitatively characterize changes in variability for processes, which is vitally important for 6-sigma QA/QC improvement initiatives. In the variance tests, the system is degraded if the sequence exhibits a change in variance by a factor of V or 1/V, where V, the pre-assigned system disturbance magnitude for the variance test, is a positive scalar. The probability that the alternative hypothesis $H_3$ is true (i.e., mean 0 and variance $V\sigma^2$) is given by (3) with $\sigma^2$ replaced by $V\sigma^2$:

$$P(y_1, y_2, \ldots, y_n | H_0) = \frac{1}{(2\pi V\sigma^2)^{n/2}} \exp\left[-\frac{1}{2V\sigma^2} \sum_{k=1}^{n} y_k^2\right] \quad (8)$$

The likelihood ratio for the variance test is given by the ratio of (8) to (3):

$$L_n = V^{-n/2} \exp\left[-\frac{1}{2\sigma^2} \frac{1 - V}{V} \sum_{k=1}^{n} y_k^2\right] \quad (9)$$

Taking the logarithm of the likelihood ratio given in (9) produces the SPRT index for the nominal-variance test ($SPRT_{nom}$):

$$SPRT_{nom} = \frac{1}{2\sigma^2}\left(\frac{V - 1}{V}\right) \sum_{k=1}^{n} y_k^2 - \frac{n}{2} \ln V \quad (10)$$

The SPRT index for the inverse-variance test ($SPRT_{inv}$) is derived by substituting 1/V for each instance of V in (8) through (10), resulting in:

$$SPRT_{inv} = \frac{1}{2\sigma^2}(1 - V) \sum_{k=1}^{n} y_k^2 + \frac{n}{2} \ln V \quad (11)$$

The tandem SPRT module performs mean, variance, and SPRT tests on the raw process signal and on its first difference function. To initialize the module for analysis of a stress-test inferential variable time-series, the user specifies the system disturbance magnitudes for the tests (M and V), the false-alarm probability ($\alpha$), and the missed-alarm probability ($\beta$).

Then, during the training phase (before the first failure of a component under test), the module calculates the mean and variance of the monitored variable process signal. For most inferential variables the mean of the raw observations for the inferential variable will be nonzero; in this case the mean calculated from the training phase is used to normalize the signal during the monitoring phase. The system disturbance magnitude for the mean tests specifies the number of standard deviations (or fractions thereof) that the distribution must shift in the positive or negative direction to trigger an alarm. The system disturbance magnitude for the variance tests specifies the fractional change of the variance necessary to trigger an alarm.

At the beginning of the monitoring phase, the system sets all six SPRT indices to 0. Then, during each time step of the calculation, the system updates the SPRT indices using (6), (7), (10), and (11). The system compares each SPRT index is then compared to the upper [i.e., $\ln((1-\beta)/\alpha]$ and lower [i.e., $\ln((\beta/(1-\alpha))]$ decision boundaries, with these three possible outcomes:

1. the lower limit is reached, in which case the process is declared healthy, the test statistic is reset to zero, and sampling continues;
2. the upper limit is reached, in which case the process is declared degraded, an alarm flag is raised indicating a sensor or process fault, the test statistic is reset to zero, and sampling continues; or
3. neither limit has been reached, in which case no decision concerning the process can yet be made, and the sampling continues.

The advantages of using a SPRT are twofold:
1. early detection of very subtle anomalies in noisy process variables; and 2. pre-specification of quantitative false-alarm and missed-alarm probabilities.

The present invention uses tandem SPRTs to monitor "derivative SPRTs" in parallel with mean and variance SPRTs that are performed on the time-series associated an inferential variable in the context of accelerated-life studies, where it is not possible to perform direct functional tests in real-time. The new tandem-SPRT approach facilitates determining the onset of hardware degradation for components under test as well as the exact time of failure (within the resolution of the time samples used for sampling the referential variable). Moreover, the onset of "spiky" degradation in components as well as degradation in the sensor that is used to measure the inferential variable can be deduced. Information from the suite of six tandem SPRTs provides a substantially complete and substantially accurate picture of the dynamic reliability of the components under test as a function of age and cumulative stress.

Detecting the Onset of Hardware Degradation

Figure 2:
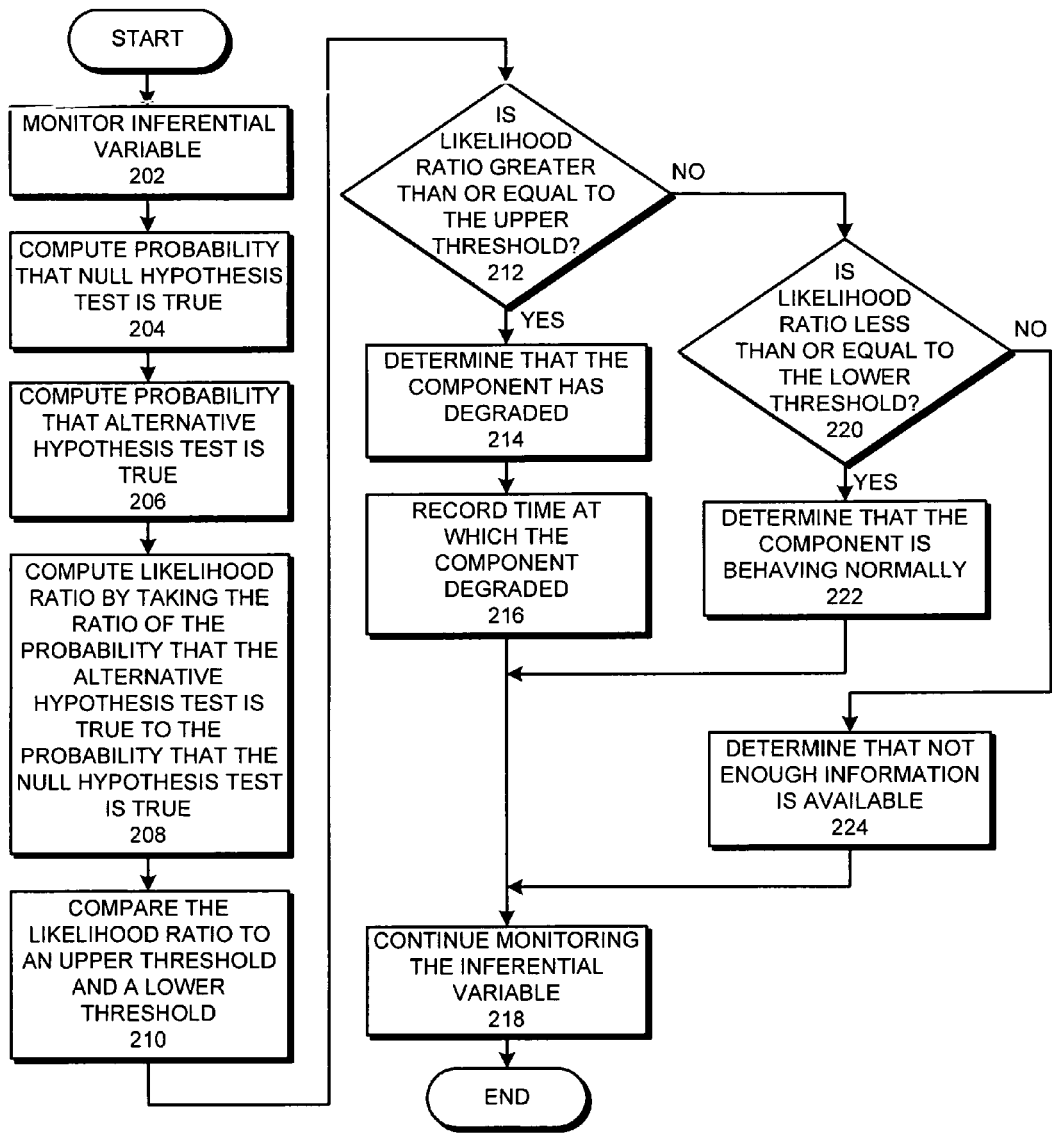
FIG. 2 presents a flow chart illustrating the process of detecting the onset of hardware degradation for components undergoing accelerated-life studies in accordance with an embodiment of the present invention

FIG. 2 presents a flow chart illustrating the process of detecting the onset of hardware degradation for components undergoing accelerated-life studies in accordance with an embodiment of the present invention.

During operation, the system monitors an inferential variable (step 202).

Next, the system computes a probability that the null hypothesis test is true (step 204) and computes the probability that an alternative hypothesis test is true (step 206). Recall that the null hypothesis is true if the specimen of the component is behaving normally and has not degraded. Conversely, the alternative hypothesis is true if the specimen of the component has degraded.

The system then computes a likelihood ratio by taking the ratio of the probability that the alternative hypothesis test is true to the probability that the null hypothesis tests is true (step 208).

Next, the system compares the likelihood ratio to an upper threshold and a lower threshold (step 210). Note that these thresholds allow the user to tune the sensitivity of the process while detecting abnormal behavior of an inferential variable.

If the likelihood ratio is greater than or equal to the upper threshold (step 212), the system determines that the component has degraded (step 214) and records the time at which the component has degraded (step 216). The system then continues monitoring the inferential variable (step 218).

On the other hand, if the likelihood ratio is less than or equal to the lower threshold (step 220), the system determines that the inferential variable is observing background variations (step 222) and continues monitoring the inferential variable (step 218).

Finally, if the likelihood ratio is between the lower and the upper thresholds, the system determines that not enough information is available (step 224) and continues monitoring the inferential variable (step 218).

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining the reliability of a component in a system, comprising:
    monitoring inferential variables associated with a number of specimens of the component during a reliability-evaluation study;
    collecting degradation data by:
        computing a likelihood value that indicates whether an inferential variable associated with a specimen of the component is behaving normally or abnormally;
        determining whether the specimen of the component has degraded based on the likelihood value; and
        if the specimen of the component is determined to have degraded, noting the time when the specimen of the component was determined to have degraded; and
    generating a population-failure distribution for the number of specimens from the degradation data; and
    using the population-failure distribution to generate a component-reliability model, wherein the component-reliability model is used to determine the reliability of the component past the point in time when the reliability-evaluation study was terminated for the number of specimens of the component.

2. The method of claim 1, wherein using the likelihood value to determine whether the specimen of the component has degraded involves:
    comparing the likelihood value with an upper threshold;
    comparing the likelihood value with a lower threshold;
    if the likelihood value is greater than or equal to the upper threshold, determining that the specimen of the component has degraded;
    if the likelihood value is less than or equal to the lower threshold, determining that the specimen of the component is behaving normally; and
    if the likelihood value is between the upper threshold and the lower threshold, determining that an inadequate amount of information is available to determine whether the specimen of the component is behaving normally or whether the specimen of the component has degraded.

3. The method of claim 1, wherein computing the likelihood value involves:
    computing the probability that a null hypothesis is true using a current value of the inferential variable and historical values of the inferential variable, wherein the null hypothesis is true if the specimen of the component is behaving normally and has not degraded;
    computing the probability that an alternative hypothesis is true using the current value of the inferential variable and historical values of the inferential variable, wherein the alternative hypothesis is true if the specimen of the component has degraded; and
    computing the likelihood value by dividing the probability that the alternative hypothesis is true by the probability that the null hypothesis is true.

4. The method of claim 3, wherein the alternative hypothesis test can include:
    a positive-mean test, which tests whether the mean of a time-series for the inferential variable is above a reference level;
    a negative-mean test, which tests whether the mean of the time-series for the inferential variable is below a reference level;
    a nominal-variance test, which tests whether the variance of the time-series for the inferential variable is proportional to a scale factor;

a inverse-variance test, which tests whether the variance of the time-series for the inferential variable is proportional to the inverse of the scale factor;

a positive first-difference test, which tests whether the time-series for the inferential variable is increasing; or a negative first-difference test, which tests whether the time-series for the inferential variable is decreasing.

5. The method of claim 1, wherein prior to monitoring inferential variables, the method comprises computing the mean and the variance of the time-series for the inferential variable by monitoring the inferential variable during a training phase; and wherein the mean and variance are used to normalize the mean and the variance of the time-series for the inferential variable while monitoring the inferential variable during the monitoring phase.

6. The method of claim 1, wherein the inferential variable can represent a current passing through the component or a voltage applied to the component.

7. The method of claim 1, wherein the reliability-evaluation study is an accelerated-life study of the component; and wherein the monitored data can be processed in real-time or can be post-processed.

8. An apparatus for determining the reliability of a component in a system, comprising:

a stress-test chamber configured to accommodate specimens of a component;

a degradation-detection mechanism;

wherein the degradation-detection mechanism is configured to:

monitor inferential variables associated with a number of specimens of the component during a reliability-evaluation study;

collect degradation data, wherein to collect degradation data, the degradation-detection mechanism is configured to:

compute a likelihood value that indicates whether an inferential variable associated with a specimen of the component is behaving normally or abnormally;

determine whether the specimen of the component has degraded based on the likelihood value; and if the specimen of the component is determined to have degraded, to note the time when the specimen of the component was determined to have degraded; and to generate a population-failure distribution for the number of specimens from the degradation data; and to use the population-failure distribution to generate a component-reliability model, wherein the component-reliability model is used to determine the reliability of the component past the point in time when the reliability-evaluation study was terminated for the number of specimens of the component.

9. The apparatus of claim 8, wherein while using the likelihood value to determine whether the specimen of the component has degraded, the degradation-detection mechanism is configured to:

compare the likelihood value with an upper threshold;

compare the likelihood value with a lower threshold;

if the likelihood value is greater than or equal to the upper threshold, to determine that the specimen of the component has degraded;

if the likelihood value is less than or equal to the lower threshold, to determine that the specimen of the component is behaving normally; and if the likelihood value is between the upper threshold and the lower threshold, to determine that an inadequate amount of information is available to determine whether the specimen of the component is behaving normally or whether the specimen of the component has degraded.

10. The apparatus of claim 8, wherein while computing the likelihood value, the degradation-detection mechanism is configured to:

compute the probability that a null hypothesis is true using a current value of the inferential variable and historical values of the inferential variable, wherein the null hypothesis is true if the specimen of the component is behaving normally and has not degraded;

compute the probability that an alternative hypothesis is true using the current value of the inferential variable and historical values of the inferential variable, wherein the alternative hypothesis is true if the specimen of the component has degraded; and to compute the likelihood value by dividing the probability that the alternative hypothesis is true by the probability that the null hypothesis is true.

11. The apparatus of claim 10, wherein the alternative hypothesis test can include:

a positive-mean test, which tests whether the mean of a time-series for the inferential variable is above a reference level;

a negative-mean test, which tests whether the mean of the time-series for the inferential variable is below a reference level;

a nominal-variance test; which tests whether the variance of the time-series for the inferential variable is proportional to a scale factor;

a inverse-variance test, which tests whether the variance of the time-series for the inferential variable is proportional to the inverse of the scale factor;

a positive first-difference test, which tests whether the time-series for the inferential variable is increasing; or a negative first-difference test, which tests whether the time-series for the inferential variable is decreasing.

12. The apparatus of claim 8, wherein prior to monitoring inferential variables, the degradation-detection mechanism is configured to compute the mean and the variance of the time-series for the inferential variable by monitoring the inferential variable during a training phase; and wherein the mean and variance are used to normalize the mean and the variance of the time-series for the inferential variable while monitoring the inferential variable during the monitoring phase.

13. The apparatus of claim 8, wherein the inferential variable can represent a current passing through the component or a voltage applied to the component.

14. The apparatus of claim 8, wherein the reliability-evaluation study is an accelerated-life study of the component; and wherein the monitored data can be processed in real-time or can be post-processed.

15. A computer system for determining the reliability of a component in a system, comprising:

a stress-test chamber configured to accommodate specimens of a component;

a degradation-detection mechanism;

wherein the degradation-detection mechanism is configured to:
  monitor inferential variables associated with a number of specimens of the component during a reliability-evaluation study;
  collect degradation data, wherein to collect degradation data, the degradation-detection mechanism is configured to:
    compute a likelihood value that indicates whether an inferential variable associated with a specimen of the component is behaving normally or abnormally;
    determine whether the specimen of the component has degraded based on the likelihood value; and
    if the specimen of the component is determined to have degraded, to note the time when the specimen of the component was determined to have degraded; and to
  generate a population-failure distribution for the number of specimens from the degradation data; and to
  use the population-failure distribution to generate a component-reliability model, wherein the component-reliability model is used to determine the reliability of the component past the point in time when the reliability-evaluation study was terminated for the number of specimens of the component.

16. The computer system of claim 15, wherein while using the likelihood value to determine whether the specimen of the component has degraded, the degradation-detection mechanism is configured to:
  compare the likelihood value with an upper threshold;
  compare the likelihood value with a lower threshold;
  if the likelihood value is greater than or equal to the upper threshold, to determine that the specimen of the component has degraded;
  if the likelihood value is less than or equal to the lower threshold, to determine that the specimen of the component is behaving normally; and
  if the likelihood value is between the upper threshold and the lower threshold, to determine that an inadequate amount of information is available to determine whether the specimen of the component is behaving normally or whether the specimen of the component has degraded.

17. The computer system of claim 15, wherein while computing the likelihood value, the degradation-detection mechanism is configured to:
  compute the probability that a null hypothesis is true using a current value of the inferential variable and historical values of the inferential variable, wherein the null hypothesis is true if the specimen of the component is behaving normally and has not degraded;
  compute the probability that an alternative hypothesis is true using the current value of the inferential variable and historical values of the inferential variable, wherein the alternative hypothesis is true if the specimen of the component has degraded; and to
  compute the likelihood value by dividing the probability that the alternative hypothesis is true by the probability that the null hypothesis is true.

18. The computer system of claim 17, wherein the alternative hypothesis test can include:
  a positive-mean test, which tests whether the mean of a time-series for the inferential variable is above a reference level;
  a negative-mean test, which tests whether the mean of the time-series for the inferential variable is below a reference level;
  a nominal-variance test; which tests whether the variance of the time-series for the inferential variable is proportional to a scale factor;
  a inverse-variance test, which tests whether the variance of the time-series for the inferential variable is proportional to the inverse of the scale factor;
  a positive first-difference test, which tests whether the time-series for the inferential variable is increasing; or
  a negative first-difference test, which tests whether the time-series for the inferential variable is decreasing.

19. The computer system of claim 15,
  wherein prior to monitoring inferential variables, the degradation-detection mechanism is configured to compute the mean and the variance of the time-series for the inferential variable by monitoring the inferential variable during a training phase; and
  wherein the mean and variance are used to normalize the mean and the variance of the time-series for the inferential variable while monitoring the inferential variable during the monitoring phase.

20. The computer system of claim 15, wherein the inferential variable can represent a current passing through the component or a voltage applied to the component.

21. The computer system of claim 15,
  wherein the reliability-evaluation study is an accelerated-life study of the component; and
  wherein the monitored data can be processed in real-time or can be post-processed.

* * * * *